US006630723B2

(12) United States Patent
Hedler et al.

(10) Patent No.: US 6,630,723 B2
(45) Date of Patent: Oct. 7, 2003

(54) LASER PROGRAMMING OF INTEGRATED CIRCUITS

(75) Inventors: Harry Hedler, Germering (DE); Roland Irsigler, Munich (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/179,751

(22) Filed: Jun. 25, 2002

(65) Prior Publication Data

US 2003/0006479 A1 Jan. 9, 2003

(51) Int. Cl.⁷ ................................................ H01L 29/00
(52) U.S. Cl. ....................... 257/529; 257/539; 257/762; 438/4; 438/132
(58) Field of Search .................. 257/529, 530, 257/762; 438/4, 132

(56) References Cited

U.S. PATENT DOCUMENTS 6,300,233 B1 * 10/2001 Lee et al. .................. 438/102
6,420,772 B1 * 7/2002 Kimmel et al. ............. 257/529

* cited by examiner

*Primary Examiner*—Jerome Jackson
(74) *Attorney, Agent, or Firm*—Jenkins, Wilson & Taylor, P.A.

(57) ABSTRACT

Laser Programming of Integrated Circuits. The invention relates to the laser adjustment or laser programming of laser fuses of an integrated circuit on a chip, with laser light, the integrated circuit having a plurality of laser fuses and being connected to a plurality of contact pads on the chip, and the chip being covered with a polymer layer which has at least windows on the plurality of contact pads, and comprising at least one wiring interconnect on the polymer layer which is electrically connected to at least one of the plurality of contact pads and ends at a predetermined location on a surface of the chip. To make it possible for integrated circuits to be programmed with laser light as late as possible in the production process, according to the invention the chip is irradiated in a predetermined region with intensive laser light, so that in the wiring interconnect there is created an interconnect opening, in the polymer layer lying thereunder there is created a layer opening and at least one of the plurality of laser fuses is interrupted in the predetermined region.

6 Claims, 3 Drawing Sheets

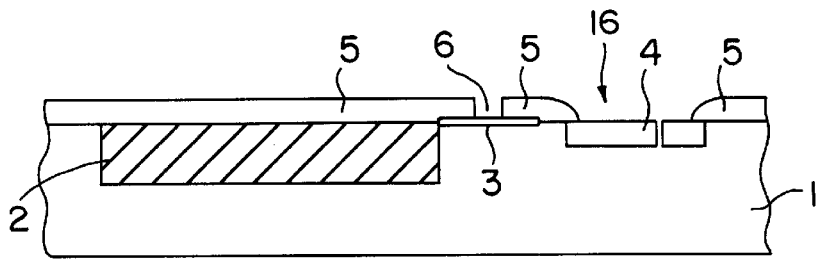
FIG. IA (PRIOR ART)
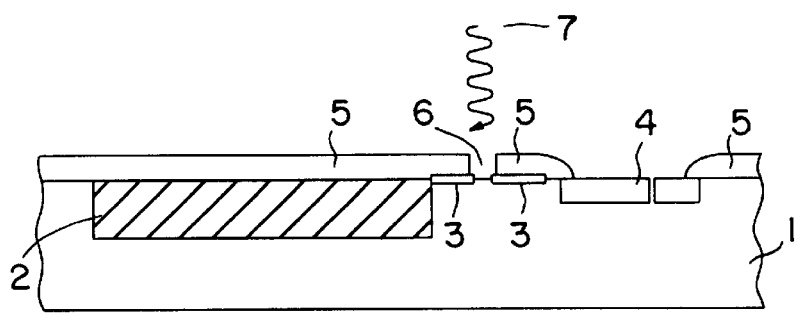
FIG. IB (PRIOR ART)
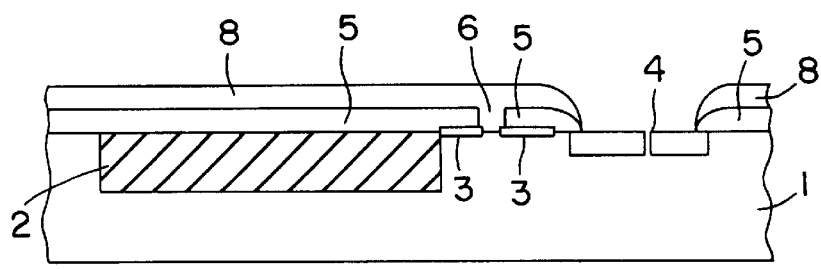
FIG. IC (PRIOR ART)
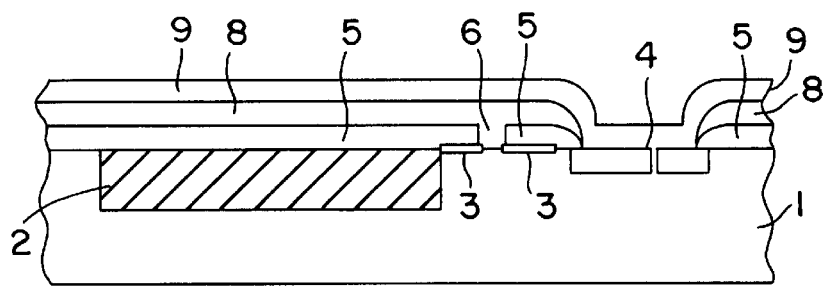
FIG. ID (PRIOR ART)

LASER PROGRAMMING OF INTEGRATED CIRCUITS

TECHNICAL FIELD

The invention relates to the laser adjustment or laser programming of laser fuses in integrated circuits. In particular, but not exclusively, the invention relates to the laser adjustment of integrated circuits in chips after packaging chip-size packages at wafer level (wafer level packaging).

BACKGROUND ART

In particular in the case of memory chips, adjustment of the circuit is required for setting a setpoint value. This adjustment is usually performed by electronic correction (for example electrical fuses) or laser-induced correction (for example laser fuses). In the case of electronic correction, implemented in the chip is a special electronic circuit, which allows electrical adjustment at the end of the production line. The disadvantage of this method is that the chip has to be increased in size by the surface area of the correction circuit (for example electronic fuse), which in turn increases the production costs. In the case of laser-induced correction, for example in the case of memory chips, laser light is used to disconnect laser fuses arranged within vias in the covering of polyimide. This takes place immediately after the completion of the wafers in the front end. Following the laser adjustment, the via openings must be closed again with a second polyimide layer, applied over a large area, to avoid short-circuits in the subsequent processes (metallization for the wiring) and to prevent corrosion of the laser fuses. Wiring is generally necessary in the case of chip-size packages (CSPs), since the spacing of the contact pads which lie near the laser vias on the front-end chip is too small to allow standard module boards to be used. This wiring, which is produced by electroplating, usually runs over the re-covered laser vias. After creating the wiring, the packaging and burn-in are performed. Since, however, the adjustment has already taken place, these later processes, possibly having adverse effects on the operation or functional ability of the circuit or the component, cannot be taken into account in the adjustment, since a laser intervention is no longer possible after the packaging. Consequently, components which exhibit additional defects precisely in these final working steps cannot be correctly adjusted, and possibly repaired. This results in increased wastage.

SUMMARY OF THE INVENTION

The object of the invention is to make it possible for integrated circuits to be programmed with laser light as late as possible in the production process, i.e. after the chip has been virtually or completely packaged, tested and a burn-in carried out, without the required surface area of the integrated circuit having to be increased.

This object is achieved by the method as claimed in claim 1 and the integrated circuit as claimed in claim 5. Preferred embodiments of the invention are the subject of the subclaims.

The invention is based on the realization that the laser adjustment carried out at the end of the production flow can lead to a simplification of the production process. This is possible in particular if packages of the CSP type are used. In the case of these packages, regions in which the laser intervention is to be performed are not buried too deep in the package, as is the case for example with a TSOP or BGA package.

The method according to the invention of programming an integrated circuit on a chip, with laser light, the integrated circuit having a plurality of laser fuses and being connected to a plurality of contact pads on the chip, and the chip being covered with a polymer layer which has at least windows on the plurality of contact pads, and comprising at least one wiring interconnect on the polymer layer which is electrically connected to at least one of the plurality of contact pads and ends at a predetermined location on a surface of the chip, is characterized in that the chip is irradiated in a predetermined region with intensive laser light, so that in the wiring interconnect there is created an interconnect opening, in the polymer layer lying thereunder there is created a layer opening and at least one of the plurality of laser fuses is interrupted in the predetermined region.

To be able to reduce the requirements for the power of the laser used as the radiation source, the wide interconnects preferably have a reduced interconnect thickness, at least in the predetermined region.

To produce the wide interconnects with a reduced interconnect thickness in at least one predetermined region, the creation of the at least one wide interconnect on the polymer layer comprises in particular the steps of: creating a seed layer on the polymer layer, creating a photoresist bridge on the seed layer over the laser fuses, creating a galvanic reinforcing layer on the seed layer and removing the photoresist bridge.

Preferably, the openings created by the laser light in the wiring interconnect and the polymer layer are covered by a printed polymer layer.

The integrated circuit produced according to the invention on a chip which has a plurality of laser fuses and is connected to a plurality of contact pads on the chip, the chip being covered with a polymer layer which has at least windows on the plurality of contact pads, and comprising at least one wiring interconnect on the polymer layer which is electrically connected to at least one of the plurality of contact pads and ends at a predetermined location on a surface of the chip, is characterized in that the at least one wiring interconnect has a reduced interconnect thickness over the at least one laser fuse.

In particular, the at least one wiring interconnect in the integrated circuit comprises a seed layer on the polymer layer and a galvanic reinforcing layer, which extends over the seed layer with the exception of over the laser fuse.

One advantage of the invention is that the production process is simplified as a whole: in the conventional technology, along with the contact pads laser vias must also be opened in the polymer covering layer by means of a highly accurate front-end photolithography. In the sequence according to the invention, this expensive step is no longer needed. Once laser programming has been performed, a second polyimide covering layer is applied, in order that the wiring can subsequently be created. In the new method, the opening of the contact pads is performed by a lower-cost back-end photolithography. The later covering of the laser openings can be performed by a simple polymer print.

Further features and advantages of the invention emerge from the following description of an exemplary embodiment, in which reference is made to the accompanying drawings.

BRIEF DESCRIPTION OF THE DRAWINGS

FIGS. 1A to 1D respectively show a cross section through a chip in the course of a production process according to the prior art.

DETAILED DESCRIPTION OF THE INVENTION

Figure 2A:
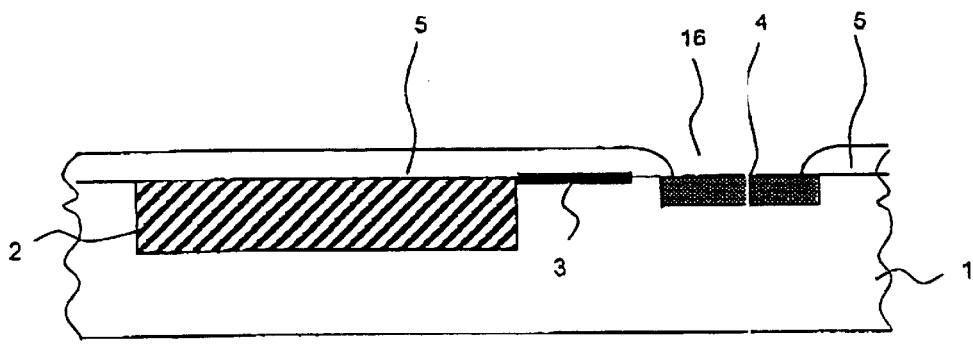
FIGS. 2A to 2F respectively show a cross section through a chip in the course of an embodiment of the production process according to the invention.

In FIGS. 1A to 1D, the sequence of a laser adjustment or programming of laser fuses in an integrated circuit according to the prior art is shown. In FIG. 1A, an integrated circuit 2 on a chip 1 is represented as a shaded rectangle. The integrated circuit 2 is connected by means of lines (not shown) to contact pads 4 and comprises several thin interconnects 3, which are referred to as laser fuses and can be interrupted by intensive laser light by melting. The laser fuses 3 lie on the surface of the chip 1; they are consequently easily accessible, as long as the surface of the chip 1 is uncovered. The chip 1 is covered with a polymer layer 5, which generally consists of a polyimide. To be able to interrupt the fuses 3 by means of intensive laser light 7, laser vias 6 are provided in the polymer layer 5 over the laser fuses 3. The intensive laser light 7 is focused through the laser vias 6 onto the fuses 3, so that they can be melted by the heat produced. Furthermore, windows 16, through which the contact pads 4 are accessible for the later production of connections, are provided in the polymer layer 5. In FIG. 1A, the chip 1 with the integrated circuit 2 is shown after the polymer layer 5 with the vias 6 and the windows 16 has been applied. The disconnection of a laser fuse 3 by the laser light 7 is shown in FIG. 1B.

After the disconnection of the laser fuse 3 at the via 6 by the laser light 7, in the case of the prior art as represented in FIG. 1C a second polymer layer 8 is deposited on the chip. The vias 6 are closed again by the second polymer layer 8. As this happens, the contact pads 4 are again kept open, so that they remain accessible for later electrical contacting.

As shown in FIG. 1D, a wiring interconnect 9, which is electrically connected to the contact pad 4 and leads the latter out to the pins of the chip package, is deposited on the second polymer layer 8.

Since, after the previous steps, the laser fuses 3 lie both under a second polymer layer 8 and under thick wiring interconnects 9, a laser adjustment after the packaging of the chip is no longer possible. This has the disadvantage that defects which only arose after the creation of the wiring interconnects 9 can no longer be rectified.

A further disadvantage of the prior art is that the further polyimide layer 8, which re-closes fuse via [sic] 6 after the laser adjustment, is necessary. Because of the required high positioning accuracy, this requires a complete photo technique. What is more, high material costs are incurred for the very expensive photosensitive polyimide (BCB, PBO).

The method according to the invention is described below on the basis of an exemplary embodiment with reference to FIGS. 2A to 2F.

In the case of the method according to the invention of programming an integrated circuit 2 on a chip 1, a polymer layer 5 is deposited on the chip 1 as in the prior art and as shown in FIG. 2A. However, it should already be pointed out that this is the only necessary polymer layer that is created in the case of the method according to the invention. The polymer layer 5 contains windows 16, so that the contact pad 4 remains accessible.

Figure 2B:
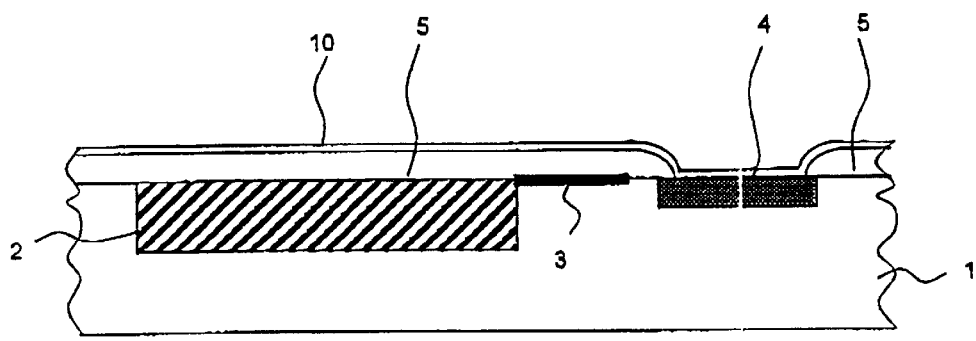

In the embodiment shown in FIG. 2B, to create the wide interconnect, firstly a seed layer 10 is created on the polymer layer 5 by sputtering. This seed layer 10 covers the entire chip 1, that is to say also the contact pad 4. The seed layer 10 is subsequently photolithographically structured, the seed layer 10 remaining covered by a photoresist bridge 11 over the regions of the laser fuses.

Figure 2C:
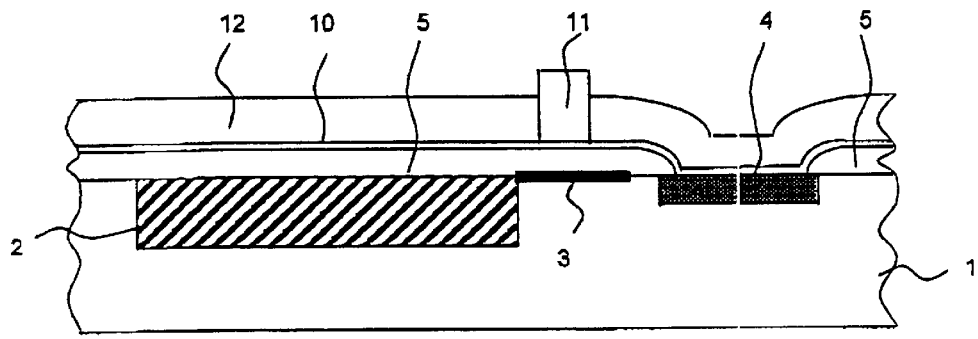

Subsequently, the seed layer 10 is galvanically reinforced, in that a galvanic reinforcing layer 12 is deposited on the seed layer. As shown in FIG. 2C, as this happens the photoresist bridge 11 over the region of the laser fuses 3 prevents the formation of the reinforcing layer 12 at this location, so that the overall thickness of the interconnect at this location remains small. The seed layer consists of a material that is identical or very similar to galvanic reinforcing layer 12, the material deposited thereon.

Figure 2D:
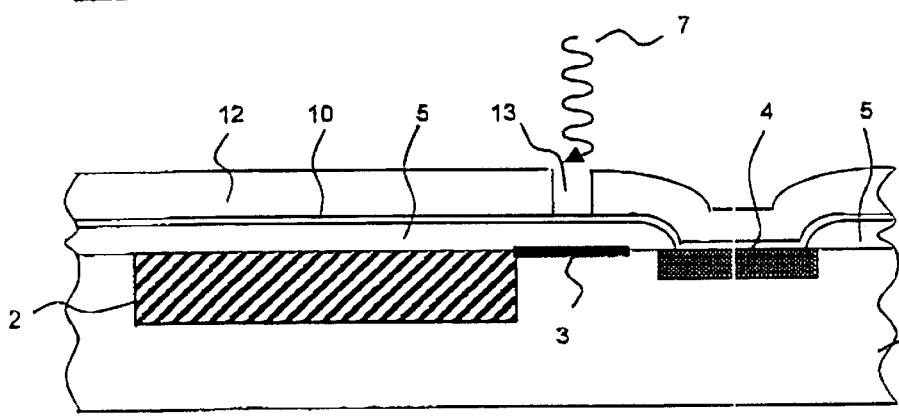
Figure 2E:
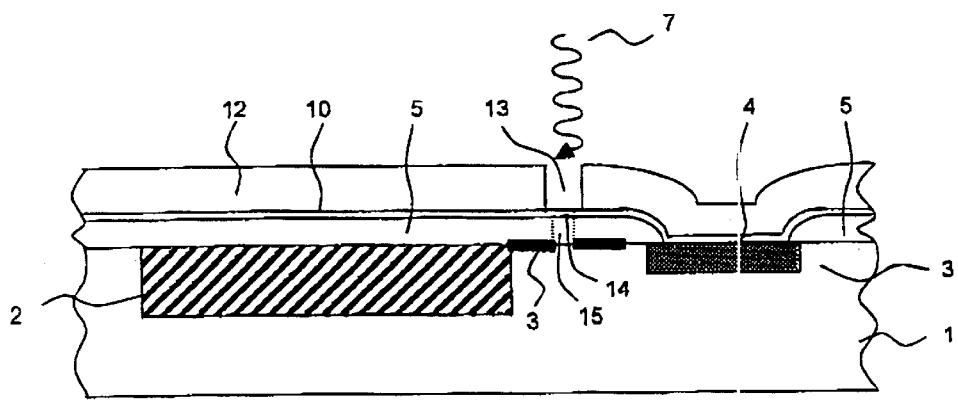

The photoresist bridge 11 is subsequently removed, and an interconnect opening 13 remains in the reinforcing layer 12 over the laser fuses 3. As shown in FIG. 2D, the laser light 7 passes through this interconnect opening 13 onto the thin seed layer 10 and creates in it, as shown in FIG. 2E, a small interconnect opening 14. Through this interconnect opening 14, the laser light 7 reaches the polymer layer 5, in which a layer opening 15 is created by the laser light 7. Through the layer opening 15, the laser light 7 finally reaches the laser fuse 3. The laser fuse 3 is melted by the laser light 7 and is consequently interrupted at the location as desired.

The interconnect openings 13 and 14 are small in relation to the horizontal extent of the seed layer 10 and the reinforcing layer 12. The two interconnect openings consequently do not impair the function [lacuna] wiring and of the polymer layer 5.

Since, what is more, the surface area of the bridge 11 is only very small, the increase in the line resistance of the wiring is also small. In the following table, a numerical example of the interconnect resistance is given.

TABLE 1

|  |  | wide interconnect | thin layer |
|---|---|---|---|
| Length | [μm] | 4000 | 20 |
| Width | [μm] | 50 | 50 |
| Thickness | [μm] | 2 | 0.2 |
| Number of squares | n | 80 | 0.4 |
| Resistance ratio per square |  | 1 | 10 |
| Product |  | 80 | 4 |
| Increase in resistance |  |  | 5% |

In table 1, Cu has been assumed as the interconnect material. As can be seen from table 1, the increase in the conductor resistance is only small. Consequently, the operating point changes only insignificantly in comparison with the conventional adjustment.

Figure 2F:
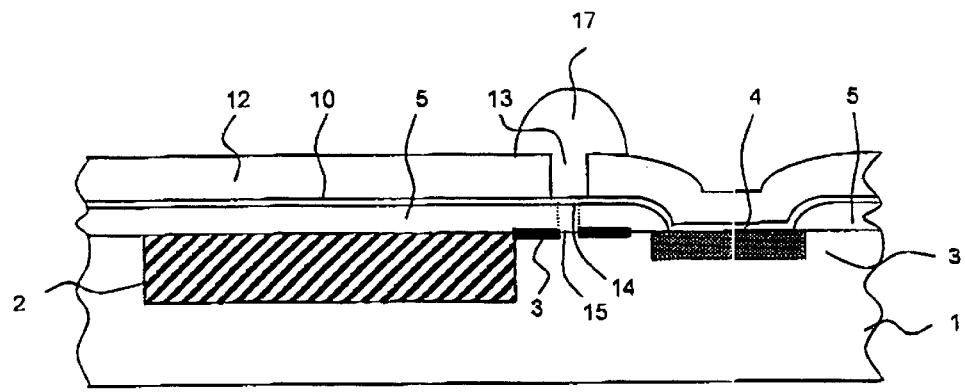

Preferably, the openings 14 created by the laser light in the wiring and the polymer layer 5 are covered by a printed polymer layer 17, as represented in FIG. 2F. Since in this case the structure resolution does not have to meet high requirements, it can be performed by a simple printing process.

Since, in spite of the shortened sequence of processing steps, it is possible to package the complete wafer (wafer level packaging) and adjust it subsequently—after the test and burn-in—, with the method according to the invention it is also possible for chips which additionally exhibit defects in the last working steps to be repaired.

This modified production sequence, that is the processing of the first (and only) polyimide layer without via [sic], the depositing and structuring of the wiring and finally the laser adjustment (laser drilling) through the wiring and through the polymer layer, achieves the effect that an expensive polyimide layer is saved, the laser adjustment can be performed at the end of the production flow on the packaged component and, what is more, it is possible to resort to a simple depositing technology for the covering layer 17 for covering the laser-drilled holes.

What is claimed is:

1. A method of programming an integrated circuit on a chip, with laser light, the integrated circuit having a plurality of laser fuses and being connected to a plurality of contact pads on the chip, and the chip being covered with a polymer layer which has at least windows on the plurality of contact pads, and comprising at least one wiring interconnect on the polymer layer which is electrically connected to at least one of the plurality of contact pads and ends at a predetermined location on a surface of the chip, wherein the chip is irradiated in a predetermined region with intensive laser light, so that in the wiring interconnect there is created an interconnect opening, in the polymer layer lying thereunder there is created a layer opening and at least one of the plurality of laser fuses is interrupted in the predetermined region.

2. The method as claimed in claim 1, wherein the wiring interconnect has a reduced interconnect thickness over the plurality of laser fuses.

3. The method as claimed in claim 1, wherein the creation of at least one wiring interconnect on the polymer layer comprises the steps of:

(a) creating a seed layer on the polymer layer;

(b) photolithographically structuring the seed layer, a photoresist bridge remaining on the seed layer over the laser fuses;

(c) creating a galvanic reinforcing layer on the structured seed layer; and (d) removing the photoresist bridge.

4. The method as claimed in claim 1, wherein the openings created by the laser light in the wiring interconnect and the polymer layer covered by a printed polymer layer.

5. An integrated circuit on a chip which has a plurality of laser fuses and is connected to a plurality of contact pads on the chip, the chip being covered with a polymer layer which has at least windows on the plurality of contact pads, and comprising at least one wiring interconnect on the polymer layer which is electrically connected to at least one of the plurality of contact pads and ends at a predetermined location on a surface of the chip, wherein the at least one wiring interconnect has a reduced interconnect thickness over at least one fuse.

6. The integrated circuit as claimed in claim 5, wherein the at least one wiring interconnect comprises: a seed layer on the polymer layer and a galvanic reinforcing layer, which extends over the seed layer with the exception of over the laser fuses.

* * * * *